United States Patent

Shea

(10) Patent No.: US 8,883,591 B2
(45) Date of Patent: *Nov. 11, 2014

(54) METHOD FOR OBTAINING EXTREME SELECTIVITY OF METAL NITRIDES AND METAL OXIDES

(71) Applicant: Micron Technology, Inc., Boise, ID (US)

(72) Inventor: Kevin R. Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/890,160

(22) Filed: May 8, 2013

(65) Prior Publication Data

US 2013/0244426 A1 Sep. 19, 2013

Related U.S. Application Data

(62) Division of application No. 13/460,528, filed on Apr. 30, 2012, now Pat. No. 8,440,525, which is a division of application No. 11/963,688, filed on Dec. 21, 2007, now abandoned, which is a division of application No. 11/000,825, filed on Nov. 30, 2004, now Pat. No. 7,312,120.

(60) Provisional application No. 60/606,836, filed on Sep. 1, 2004.

(51) Int. Cl.
| | | |
|---|---|---|
| *H01L 21/8234* | (2006.01) |
| *H01L 21/8244* | (2006.01) |
| *H01L 21/3213* | (2006.01) |
| *H01L 21/768* | (2006.01) |
| *H01L 21/311* | (2006.01) |
| *H01L 49/02* | (2006.01) |
| *H01L 27/108* | (2006.01) |

(52) U.S. Cl.
CPC .... *H01L 21/76865* (2013.01); *H01L 21/32134* (2013.01); *H01L 21/31111* (2013.01); *H01L 27/10852* (2013.01); *H01L 28/91* (2013.01)
USPC .......................................... 438/238; 438/253

(58) Field of Classification Search
USPC .......................................... 438/255, 253, 238
See application file for complete search history.

(56) References Cited

U.S. PATENT DOCUMENTS 3,629,088 A 12/1971 Frank et al.
5,278,091 A 1/1994 Fazan et al.
(Continued)

OTHER PUBLICATIONS

Jones et al., "Wet-chemical etching and cleaning of silicon," Jan. 2003, pp. 1-11, Virginia Semiconductor Inc., Fredericksburg, VA.

*Primary Examiner* — Phat X Cao
(74) *Attorney, Agent, or Firm* — Knobbe, Martens, Olson & Bear LLP

(57) ABSTRACT

Methods for etching metal nitrides and metal oxides include using ultradilute HF solutions and buffered, low-pH HF solutions containing a minimal amount of the hydrofluoric acid species $H_2F_2$. The etchant can be used to selectively remove metal nitride layers relative to doped or undoped oxides, tungsten, polysilicon, and titanium nitride. A method is provided for producing an isolated capacitor, which can be used in a dynamic random access memory cell array, on a substrate using sacrificial layers selectively removed to expose outer surfaces of the bottom electrode.

16 Claims, 9 Drawing Sheets

(56) References Cited

U.S. PATENT DOCUMENTS

| | | |
|---|---|---|
| 5,354,705 A | 10/1994 | Mathews et al. |
| 5,539,230 A | 7/1996 | Cronin |
| 5,868,948 A | 2/1999 | Fujii et al. |
| 5,937,294 A * | 8/1999 | Sandhu et al. ............... 438/255 |
| 5,940,713 A | 8/1999 | Green |
| 5,940,714 A | 8/1999 | Lee et al. |
| 5,956,587 A | 9/1999 | Chen et al. |
| 5,998,257 A | 12/1999 | Lane et al. |
| 6,104,055 A | 8/2000 | Watanabe |
| 6,180,450 B1 | 1/2001 | Dennison et al. |
| 6,184,079 B1 | 2/2001 | Lee |
| 6,221,711 B1 | 4/2001 | Roberts et al. |
| 6,312,986 B1 | 11/2001 | Hermes |
| 6,350,647 B2 | 2/2002 | Sakao |
| 6,365,453 B1 | 4/2002 | DeBoerb et al. |
| 6,372,574 B1 | 4/2002 | Lane et al. |
| 6,451,661 B1 | 9/2002 | DeBoer et al. |
| 6,451,667 B1 | 9/2002 | Ning |
| 6,458,652 B1 | 10/2002 | Chen et al. |
| 6,507,064 B1 | 1/2003 | Tang et al. |
| 6,524,912 B1 | 2/2003 | Yang et al. |
| 6,569,689 B2 | 5/2003 | Marsh |
| 6,596,641 B2 | 7/2003 | Jost et al. |
| 6,635,547 B2 | 10/2003 | DeBoer et al. |
| 6,667,209 B2 | 12/2003 | Won et al. |
| 6,670,238 B2 | 12/2003 | DeBoer et al. |
| 6,890,841 B2 | 5/2005 | Lee et al. |
| 6,962,846 B2 | 11/2005 | Fishburn et al. |
| 7,235,142 B2 | 6/2007 | Sturgill et al. |
| 7,297,591 B2 | 11/2007 | Won et al. |
| 7,312,120 B2 * | 12/2007 | Shea ............................. 438/255 |
| 2001/0028077 A1 | 10/2001 | Nakamura et al. |
| 2002/0020869 A1 | 2/2002 | Park et al. |
| 2002/0084480 A1 | 7/2002 | Basceri et al. |
| 2002/0168830 A1 | 11/2002 | DeBoer et al. |
| 2003/0001268 A1 | 1/2003 | Oh |
| 2003/0119250 A1 | 6/2003 | Lee |
| 2003/0190808 A1 | 10/2003 | Kim et al. |
| 2004/0145057 A1 | 7/2004 | Choi |
| 2005/0250339 A1 | 11/2005 | Shea et al. |
| 2005/0280060 A1 * | 12/2005 | Juengling .................... 257/296 |
| 2006/0011587 A1 | 1/2006 | Shea |
| 2006/0043451 A1 | 3/2006 | Shea |

* cited by examiner

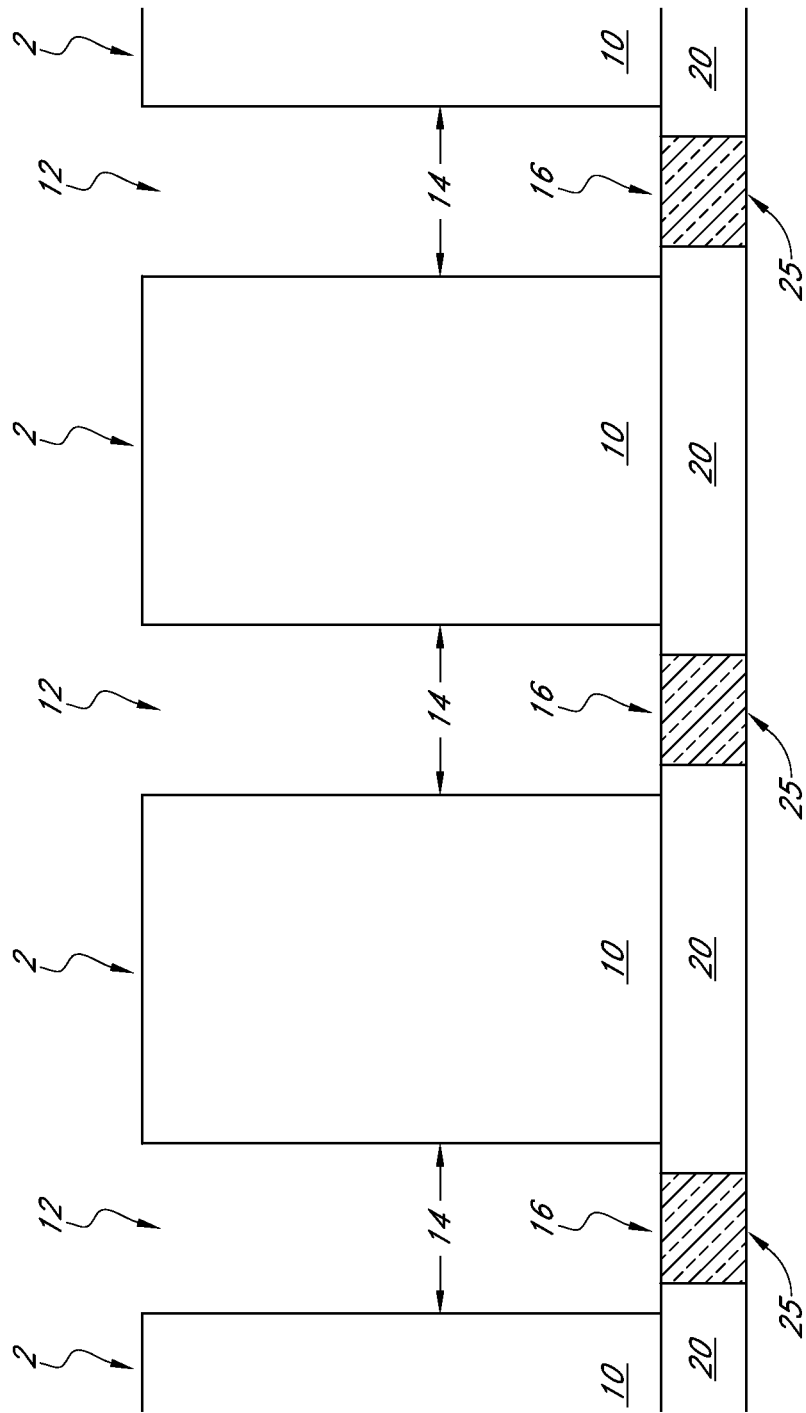

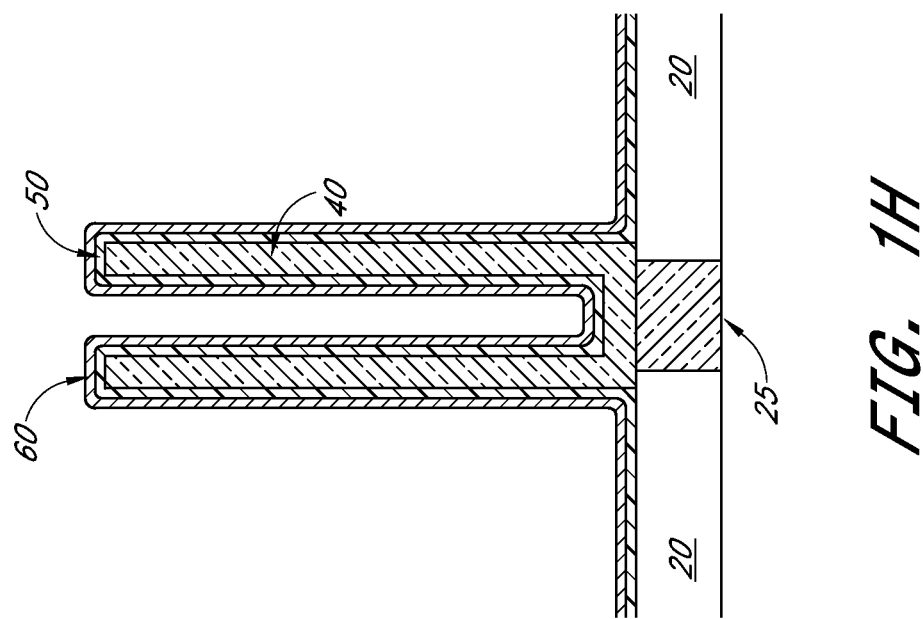

METHOD FOR OBTAINING EXTREME SELECTIVITY OF METAL NITRIDES AND METAL OXIDES

CROSS REFERENCE TO RELATED APPLICATIONS

This application is a divisional of U.S. patent application Ser. No. 13/460,528, filed Apr. 30, 2012 and issued as U.S. Pat. No. 8,440,525, which is a divisional of U.S. patent application Ser. No. 11/963,688, filed Dec. 21, 2007 (abandoned), which is a divisional of U.S. patent application Ser. No. 11/000,825, filed Nov. 30, 2004 and issued as U.S. Pat. No. 7,312,120, which claims priority under 35 U.S.C. §119(e) to U.S. Patent Application No. 60/606,836, filed Sep. 1, 2004, the disclosures of which are hereby incorporated by reference in their entireties.

BACKGROUND OF THE INVENTION

1. Field of the Invention

The present invention relates to fabrication of electronic devices and, in particular, relates to etching layers in the fabrication of integrated circuits.

2. Description of the Related Art

Since the introduction of the digital computer, electronic storage devices have been a vital resource for the retention of data. Conventional semiconductor electronic storage devices typically incorporate capacitor and transistor type structures, which are referred to as Dynamic Random Access Memory (DRAM) that temporarily store data based on the charged state of the capacitor structure. In general, this type of semiconductor Random Access Memory (RAM) often requires densely packed capacitor structures that are easily accessible for electrical interconnection. Many of these capacitor structures are fabricated with layers of material including semiconductor, dielectric, and metal.

One highly effective capacitor structure is the double-sided container capacitor. Such a device is described in U.S. Pat. No. 6,451,661 to DeBoer et al. Double-sided container capacitors typically have a cup-shaped lower electrode. A capacitor dielectric is applied over the lower electrode both internally and externally to the cup-shaped lower electrode. The upper electrode is then deposited over the capacitor dielectric. By employing this folding shape, the capacitor uses a relatively small amount of real estate on the integrated circuit but provides a suitably high capacitance.

Some capacitor structures have lower electrodes that are fabricated by first forming sacrificial spacers within a recess in a substrate, and then forming the lower electrode within the recess and between the sacrificial layer on the sidewalls of the recess. Such a method is described in co-owned U.S. patent application Ser. No. 10/714,115, which was filed on Nov. 13, 2003. The selection of the materials used for the lower electrode material is often dictated by the availability of an etching process with a suitably high selectivity ratio between the two materials. The selectivity ratio is defined as the difference of the removal rate between two materials during an etching process. Typically, an etching process is considered selective if the selectivity ratio is greater than 10 to 1, but for many applications, that selectivity ratio is not sufficient. The sacrificial spacer must be etched away without significantly damaging the surrounding layers, especially the lower electrode. In addition to DRAM, other memory arrays, such as ferroelectric and magnetic RAM, require separation of cells from one another.

There are two major methods of etching integrated circuits (ICs). First, dry etching involves the use of plasma processes to remove films from the substrate. While this method is usually very accurate, it is expensive and can cause damage to underlying layers, as it typically has poor selectivity due to a significant physical component to the etch. Wet etching involves using chemicals usually in an aqueous solution with etching chemicals such as hydrofluoric acid, nitric acid, and acetic acid. While wet etching is isotropic, meaning that it etches in all directions equally, this process is more cost-effective, allows batch processing of wafers, and is typically more selective than dry etching.

Hydrofluoric (HF) acid chemistry solutions are used to etch many films, primarily silicon oxide. Although they can be slower, dilute HF chemistries are often used to control the etching process for other films. Generally, a HF solution is considered to be dilute if the concentration is less than about 100:1. For example, aluminum nitride (AlN) is etched by a solution of 500 parts water to 1 part HF at a rate of about 60 Å per minute. Hafnium nitride (HfN) is etched by the same solution at a rate of about 90 Å per minute. Standard borophosphosilicate glass (BPSG) etches at about 30 Å per minute in this solution. Thus, for example, when using the above solution, the rate of selectivity between HfN and BPSG would be about 3:1.

Many etchants are not sufficiently selective for use in forming DRAM capacitors, or they only allow for a limited selection of materials to be used as the sacrificial spacer and lower electrode. Different etchants must be used for capacitor structures with different electrodes and spacers. This adds costs and inefficiencies to the fabrication process. Improved selectivity of etch is similarly desirable in a variety of other contexts for semiconductor fabrication. Hence, there currently exists a need to reduce manufacturing costs associated with fabricating capacitor structures by simplifying inefficient procedures. To this end, there also exists a need to increase fabrication efficiency by improving the processing techniques associated with fabricating capacitor structures.

SUMMARY OF THE INVENTION

In accordance with one aspect of the invention, a method is provided for forming an isolated capacitor on a substrate. The method comprises forming a recess, which has a base and side walls, in a structural layer. The recess is then lined with a metal oxide or metal nitride sacrificial layer. A first conductive layer is then formed within the recess over the sacrificial layer. The sacrificial layer is then removed from the recess using a reduced-$H_2F_2$ HF chemistry solution. A conformal capacitor dielectric is formed over the lower electrode. A second conductive layer is formed over the conformal capacitor dielectric.

In another aspect of the invention, a method is provided for etching metal nitrides and metal oxides. An aqueous hydrofluoric acid etch solution having a ratio of water to hydrofluoric acid of between about 1,000:1 to 10,000:1 by volume is applied to a metallic layer adjacent to an exposed silicon oxide based layer. The metallic layer is etched with an etch rate selectivity to the adjacent silicon oxide based layer of greater than about 500:1.

In another aspect of the invention, a method is provided for etching metal nitrides and metal oxides. The method comprises heating a substrate that has a layer of a metal oxide or metal nitride. A buffered, wet hydrofluoric acid etch solution with a pH of between about 3.5 and 5.5 to the substrate. The solution etches the metal oxide or metal nitride layer on the substrate with an etch rate selectivity to an exposed layer of silicon of greater than or equal to about 2000:1. In another aspect of the invention, a method is provided for forming an isolated conductor on a substrate comprising forming a recess on the substrate and lining the recess with a metal nitride or metal oxide sacrificial layer. An electrode material is deposited within the recess before removing the sacrificial layer with an aqueous etchant, wherein the etchant has an etch rate selectivity to the electrode material of greater than about 500:1.

In accordance with another aspect of the invention, a capacitor is provided in an integrated circuit. The circuit includes a conductive plug, and a container-shaped lower electrode comprising titanium nitride or tungsten directly connected to the conductive plug. A conformal capacitor dielectric extends over inner and outer surfaces of the lower electrode. An upper electrode extends over the conformal capacitor dielectric.

BRIEF DESCRIPTION OF THE DRAWINGS

FIGS. 1A-1I are a series of schematic cross sections, illustrating one embodiment of a method for forming a capacitor structure in accordance with a preferred embodiment of the present invention.

DETAILED DESCRIPTION OF THE PREFERRED EMBODIMENT

Methods are provided herein for selectively etching metallic layers, particularly metal oxides and metal nitrides. In the illustrated embodiments, a layer of metal oxide or metal nitride can be selectively etched relative to layers of doped oxides, undoped oxides, polysilicon, titanium nitride or tungsten. A layer or multiple layers of a metal nitride or a metal oxide sacrificial spacer is formed within layers of doped oxides, undoped oxides, polysilicon, titanium nitride or tungsten. The sacrificial spacer is then etched by using an etchant with a low percentage of the $H_2F_2$ species of hydrogen fluoride, creating a void within the structure.

Figure 3:
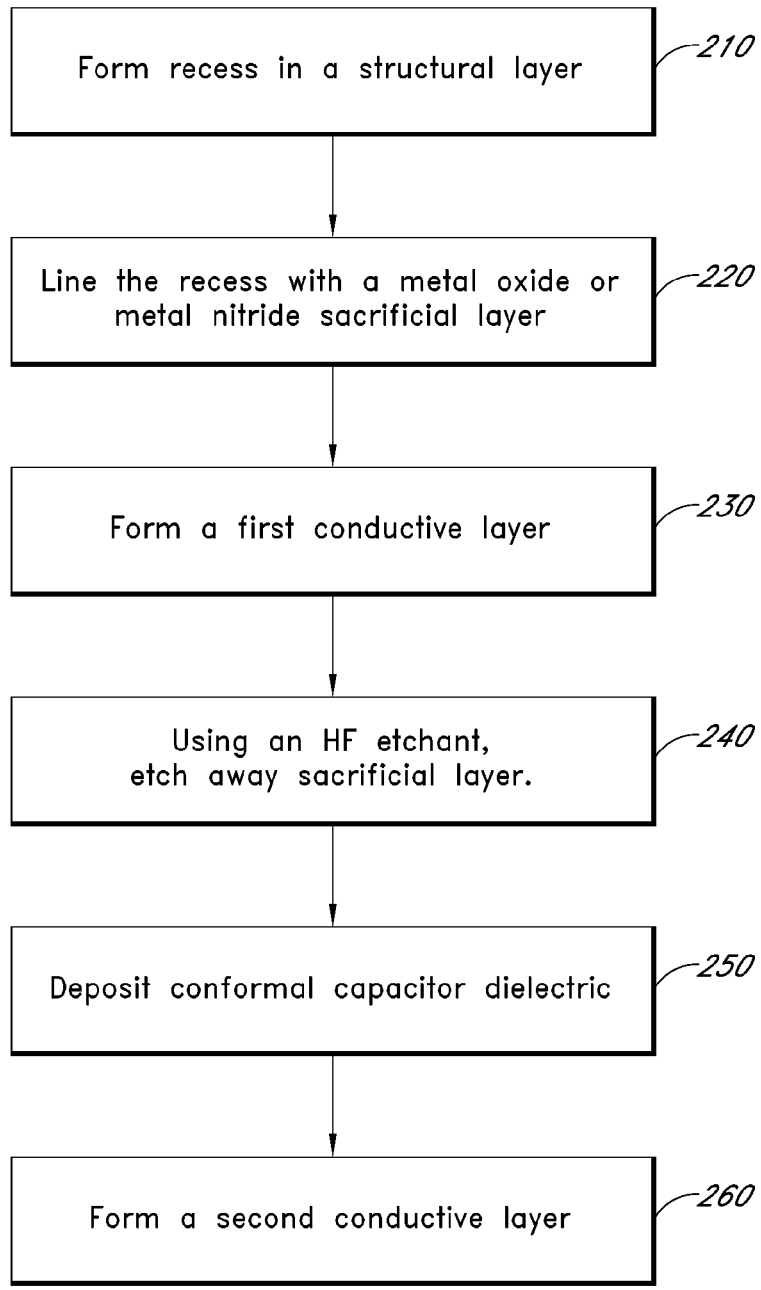
FIG. 3 is a flow chart of a method for forming a capacitor structure in accordance with a preferred embodiment of the present invention.

A method for forming an isolated capacitor on a surface is taught in another embodiment, represented by the flow chart of FIG. 3. A recess is formed 210 within a structural layer. A sacrificial layer is deposited 220 along the surface of the structural layer and into the recess. The sacrificial layer is preferably metallic, and in the illustrated embodiment comprises a metal oxide or metal nitride. A first conductive layer is formed 230 within the recess. The sacrificial layer is removed 240 from the recess by using a highly selective etchant, preferably a hydrofluoric acid based etchant with a low percentage of the $H_2F_2$ species of hydrogen fluoride. A capacitor dielectric is then formed 250 conformally over the lower electrode. An upper electrode is then formed 260 over the capacitor dielectric.

Hydrofluoric acid (HF) chemistries are often used to etch metal nitrides and metal oxides. There are several species in fluorinated chemistry etchants that accomplish etching. These include HF, $H_2F_2$, $HF_2^-$, and $F^-$. However, without being bound by theory, it appears that the species that primarily etches doped and undoped oxides is $H_2F_2$. Several species of fluorides etch most metal nitrides and metal oxides, primarily $H_2F_2$, $HF_2^-$, and $F^-$. In one embodiment of the invention, the $H_2F_2$ species is reduced, and the $HF_2^-$ and $F^-$ species are increased in the solution. In embodiments of the invention this is accomplished by extreme dilution and/or buffering methods. In a preferred embodiment the $H_2F_2$ species is kept low relative to the four etching species, HF, $H_2F_2$, $HF_2^-$, and $F^-$.

The solutions with a low concentration of the $H_2F_2$ species are then used to selectively remove metallic films, including metal oxide and metal nitride films. The etchant can also be used to pull back a metal oxide film when it is contained in a sandwich-like stack or to etch out these films as sacrificial spacers where selectivity is needed relative to oxides, polysilicon, tungsten, and titanium nitride.

In one embodiment, the etchant is a highly buffered HF solution, raising the pH. Adding a base to the HF solution is one way to raise the pH. Many materials can be used to buffer the HF solution and raise the pH. At low pH, the solution has a significant concentration of $H_2F_2$. Preferably, the pH of the buffered solution is between about 3.5 and 5.5. More preferably, the pH of the buffered solution is between about 4.0 and 5.0. Most preferably, the pH of the buffered solution is between about 4.25 and 4.75. One preferred embodiment of a buffered HF solution is to use buffered oxide etch (BOE). Traditionally, BOE is used to etch oxides, but at very high buffer (e.g., $NH_4F$) concentrations, BOE does not substantially etch oxides. In a preferred embodiment, the buffer to HF ratio is greater than 400 to 1. In a more preferred embodiment, the buffer to HF ratio is greater than 500 to 1. The etchant is not limited to these preferred embodiments, as skilled practitioners will appreciate in view of the present disclosure that other methods of reducing the $H_2F_2$ species of hydrofluoric acid can be used.

In another preferred embodiment, the etchant is an ultra dilute HF solution. Preferably, the ratio by volume of water to HF is between about 1,000 to 1 and 10,000 to 1 as-mixed. More preferably, the as-mixed volume ratio of water to HF is between about 1,500 to 1 and 5,000 to 1. Most preferably, the as-mixed volume ratio of water to HF is between about 2,500 to 1 and 4,000 to 1. In one embodiment, approximately 1 mL of 49% HF was added to between about 1000 mL to 5000 mL of distilled water. To accelerate the etch process, the solution is then heated to a temperature of between about 50° C. and 90° C., more preferably between about 60° C. and 85° C. Within this range, the primary active species in the solution is $F^-$. A preferred pH range for the ultradilute HF solution is between about 2.5 and 3.0. Using dilute HF, the mole fraction of $H_2F_2$ can be reduced below 0.06 mole fraction, more preferably below 0.04 mole fraction. In other words, preferably less than one of twenty of the hydrofluoric acid molecules will be $H_2F_2$. Table 1 below provides estimated mole fractions for each of the species.

TABLE 1

ESTIMATED ACTUAL MOLE FRACTIONS FOR THREE AS-MIXED CONCENTRATIONS

| Species/Concentration | 1500:1 by volume | 2000:1 by volume | 5000:1 by volume |
|---|---|---|---|
| HF | 0.75 mole fraction | 0.75 mole fraction | 0.65 mole fraction |
| $H_2F_2$ | 0.03 mole fraction | 0.03 mole fraction | 0.02 mole fraction |
| $HF_2^-$ | 0.03 mole fraction | 0.025 mole fraction | 0.02 mole fraction |
| $F^-$ | 0.18 mole fraction | 0.2 mole fraction | 0.3 mole fraction |

Using the above-described solutions, etch rate selectivity ratios are excellent. For metal nitride etching, selectivity ratios to doped and undoped oxides can easily exceed about 500:1. For preferred materials to be etched, such as hafnium nitride (HfN) and aluminum nitride (AlN), the same ratio is greater than about 1,000:1. The selectivity ratio of metal nitride etch rates to polysilicon etch rates is even higher. For metal nitrides, the etch rate to poly is preferably greater than about 2,000:1. For preferred materials HfN and AlN, the same ratio is more preferably greater than about 9,000:1.

In a preferred embodiment, the sacrificial layer is $Al_2O_3$. To accomplish the removal of the sacrificial layer, the etching solution should get all the way down a narrow capillary where the sacrificial layer resides without excessive damage to surrounding materials, as will be better understood from the discussion of the figures below. The removal of the sacrificial layer should accordingly be quick. For a metal oxide, a rate of about 5000 Å/min or faster is desirable to etch to the bottom of the capillary where the sacrificial layer resides. When using certain materials, such as $Al_2O_3$, as the sacrificial layer, heat is preferably used to expedite the etch process. The solution is preferably heated to a temperature of between about 50° C. and 90° C., more preferably between about 60° C. and 85° C., and most preferably between about 70° C. and 80° C. However, for some embodiments, the temperature does not need to be raised to etch out the capillary. For example, in an embodiment where the sacrificial layer is HfN, the etch rate using the preferred etchants is high enough that the whole capillary can be etched without requiring additional heat. However, the etch process is preferably facilitated by using a temperature within the ranges noted above. A skilled practitioner can determine whether the material etches fast enough down a narrow capillary, or whether heat should be applied.

As described below with respect to FIGS. 1A-1I, the etchants described herein are useful in creating capacitors for integrated circuits. An application describing the The $H_2F_2$-reduced etchant can remove a sacrificial layer without substantially etching parts of the lower electrode or other surrounding layers. Because HF solutions with reduced $H_2F_2$ species remove sacrificial layers with minimal damage to surrounding layers, they are particularly applicable to producing isolated capacitors.

Figure 1A:
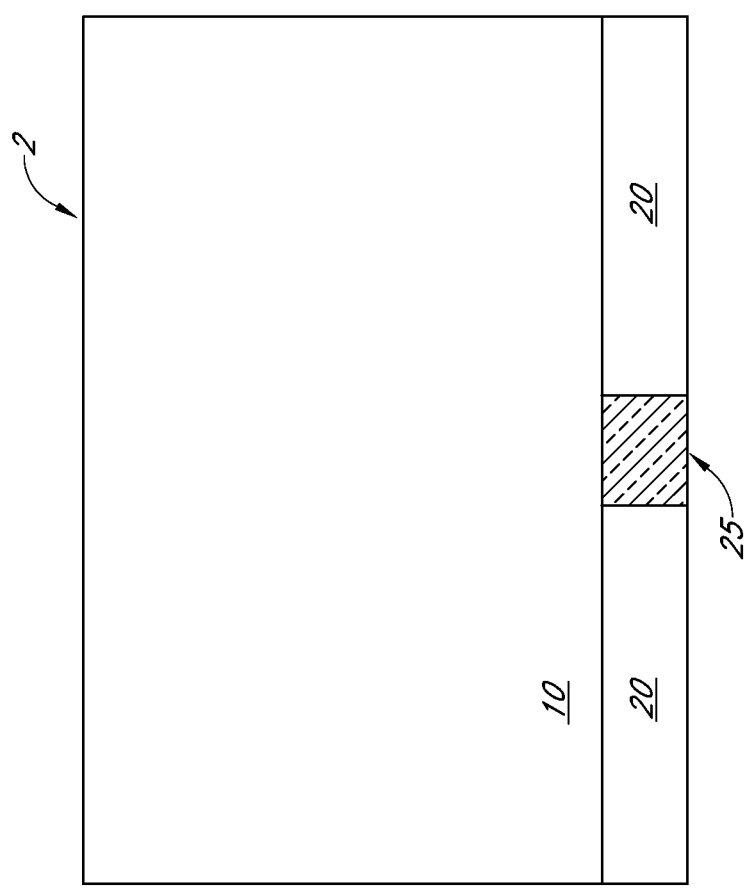

FIGS. 1A-1I show an embodiment of a method for forming isolated capacitor structures using the reduced $H_2F_2$ species HF etchant. A structural layer 10, preferably in the form of a first interlayer dielectric (ILD) layer, is deposited on a second ILD layer 20, as shown in FIG. 1A. In one embodiment, the ILD or structural layer 10 may comprise an insulative material, such as borophosphosilicate glass (BPSG), or other generally known materials, such as phosphosilicate glass (PSG), tetraethylorthosilicate (TEOS), silicon, glass, polymer, etc. The second ILD layer 20 surrounds a conductive plug 25, which preferably contacts structural layer 10. The plug 25 preferably comprises an electrical interconnect, which can connect the capacitor to another circuit component, such as a transistor, resistor, etc. Although only one plug 25 is shown in FIG. 1A, it will be understood that there is a plug 25 for each cell in the array.

As used herein, "substrate" may comprise at least a portion of a conventional silicon wafer, but can more generally encompass structures such as semiconductive material or similar variations. Moreover, the term "substrate" may also encompass any supporting or layered structures, including, but not limited to, oxide or semiconductive structures, layers, or substrates.

In FIG. 1B, several containers or recesses 12 have been formed in the structural layer 10. The recesses 12 can be formed through generally known mask and etch techniques, although preferably an anisotropic etch method, such as reactive ion etching (ME) is used. Each recess 12 is preferably etched to a depth of about 2 microns, preferably vertically into the structural layer 10. Each recess 12 is preferably etched to provide an electrical contact to the conductive plug 25 and has sidewalls 14 and a base 16. Preferably, each recess 12 will be approximately centered over one of the conductive plugs 25. The depth, shape and other properties of the recesses can be altered for different applications without departing from the scope of the present teachings.

Figure 1C:
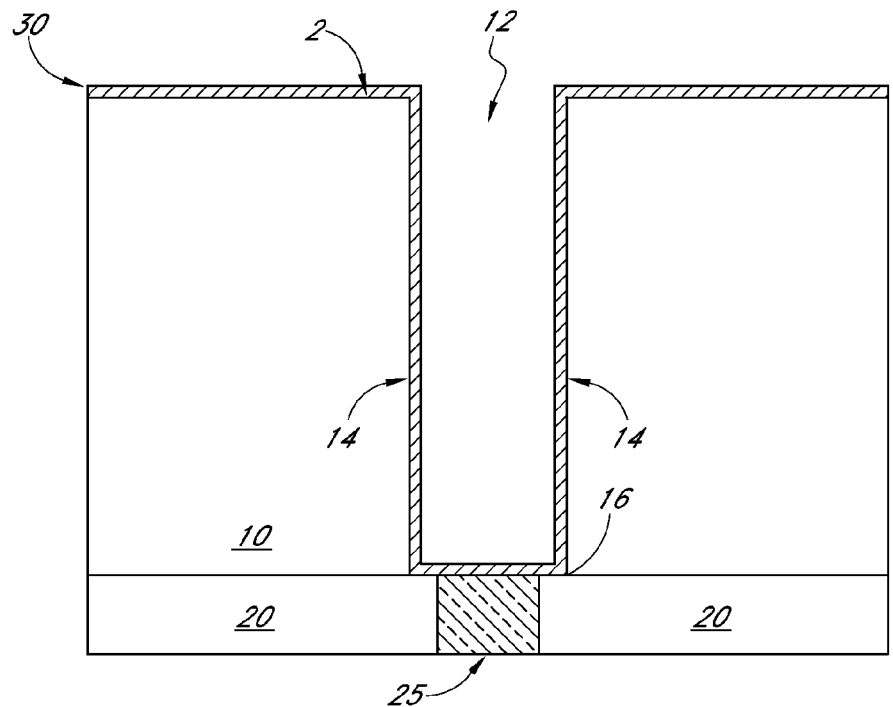
Figure 1D:
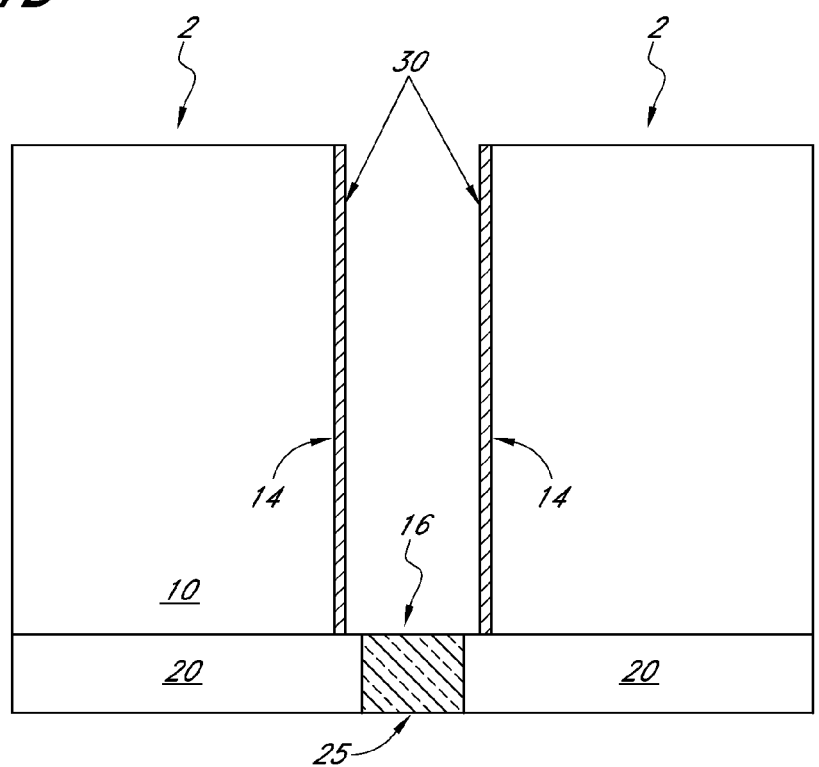
Figure 1E:
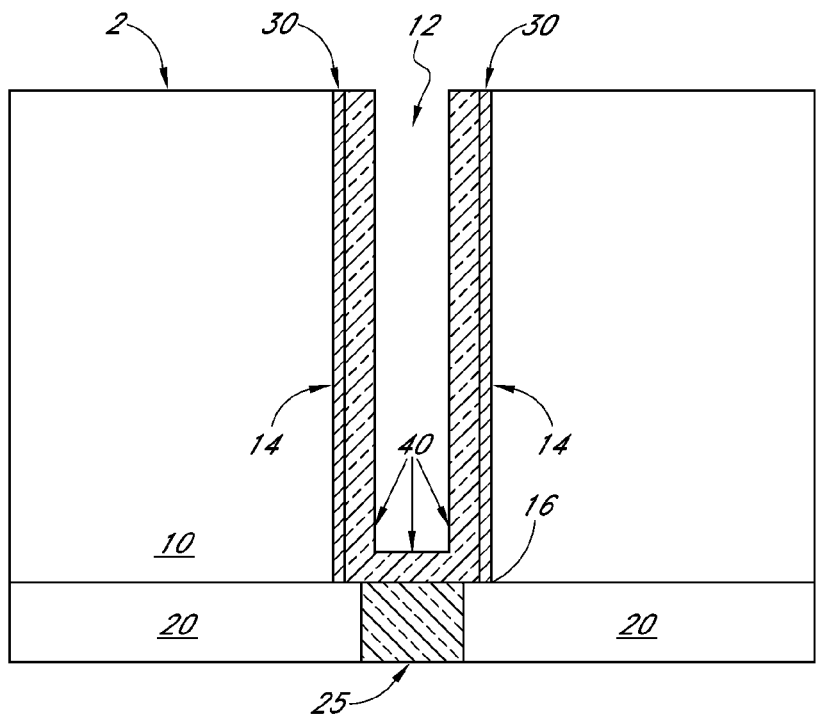
Figure 1F:
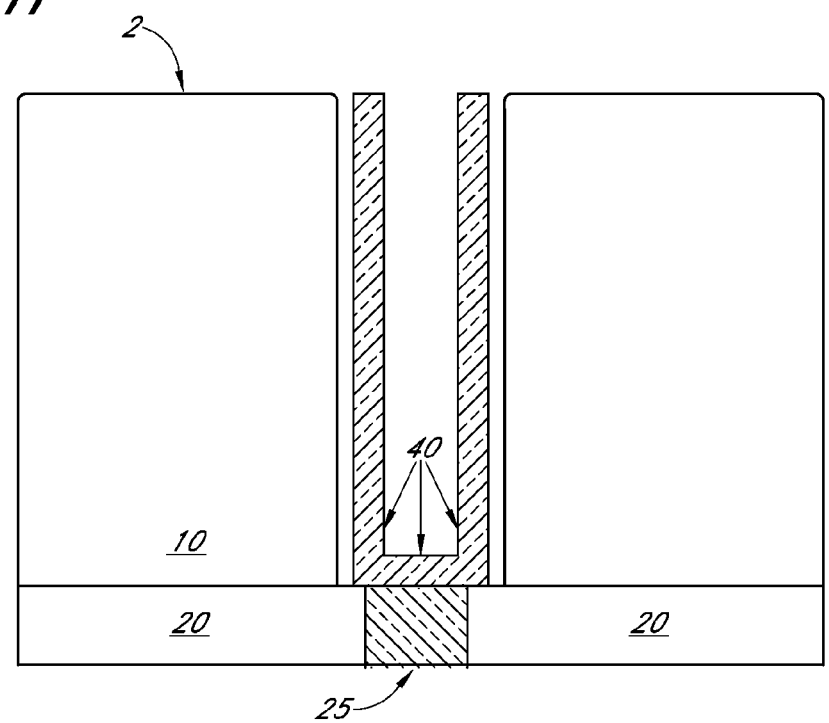
Figure 1G:
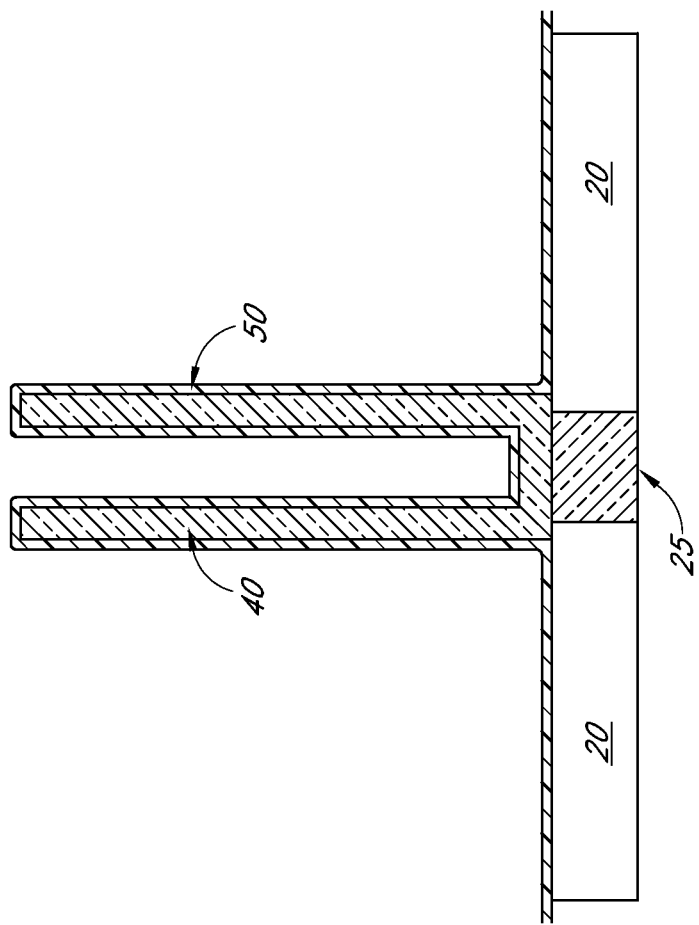
Figure 1I:
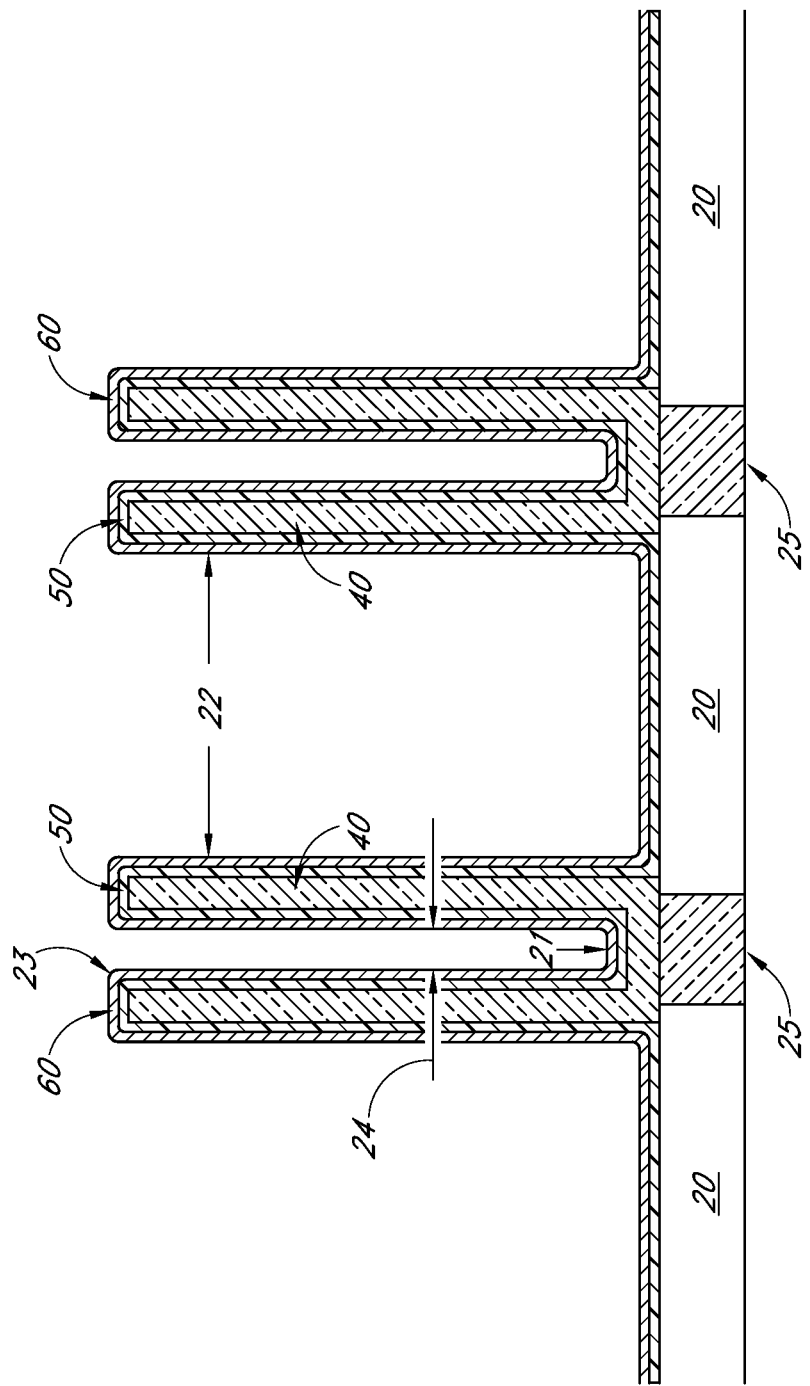

Multiple recesses are shown in FIGS. 1B and 1I to illustrate the memory array context for these capacitors. Preferably, the capacitors of the embodiment shown in FIGS. 1A-1I are in a memory cell array. The recesses will preferably be spaced apart between about 50 nm and 160 nm, more preferably between about 60 nm and 150 nm. FIGS. 1C-1H show only one recess for simplicity of the drawings.

FIG. 1C illustrates the deposition of a sacrificial layer 30 on the upper surface 2 of the structural layer 10 and within the cell container 12. Preferably, the sacrificial layer 30 will adhere to the base 16 and sidewalls 14 of the recess. In one embodiment, the sacrificial layer 30 may be deposited using, for example, a known deposition process, such as chemical vapor deposition (CVD) or plasma enhanced CVD (PECVD). The sacrificial layer 30 is preferably metallic and more preferably a metal oxide or a metal nitride. Some examples include AlN, $Al_2O_3$, HfN, and $HfO_2$. Many of these examples are dielectric materials, which has consequences for the sequence of steps for the process described herein. Most metal nitrides and metal oxides will be suitable materials for the sacrificial material, with the notable exception that titanium nitride is not etched by the etchants described herein.

FIG. 1D illustrates the removal of the horizontal portions of the sacrificial layer from the upper surface 2 of the structural layer 10 and the base 16 of the recess. This exposes the plug 25 for the deposition of the lower electrode. This is preferably performed by a directional etching process, more preferably a dry-etch anisotropic method, such as ME. The directional etching process preferentially removes horizontal surfaces in a process known as a spacer etch. The directional etch leaves vertical layers, such as the sacrificial spacer 30 on the sidewalls 14 of the recess.

FIG. 1E shows the formation of a lower electrode 40. The lower electrode is formed by first depositing a layer within the recess and over the structural layer 10, with the bottom of the electrode material contacting the plug 25. The lower electrode layer is preferably in contact with the sacrificial layer 30 on the sidewalls 14 of the recess 12. The via is then filled with a protective filler (e.g., photoresist) and the structure subjected to chemical mechanical planarization (CMP) or other etch back process to leave the structure shown in FIG. 1E.

The lower electrode 40 should not be etched by the HF solution having low $H_2F_2$ species. In the embodiment shown in FIG. 1E-1H, the lower electrode is polysilicon, but there are also several other options for the lower electrode materials. Preferable lower electrode materials also include titanium nitride and tungsten, but other materials may be used without exceeding the scope of the present teachings. Preferably, the lower electrode is made of polysilicon or titanium nitride. These materials are particularly well suited to acting as electrodes.

In the past, different etchants have been used to remove sacrificial layers for different process flows with these different lower electrode materials, because the etchants available were not selective to both titanium nitride and poly. However, with etchants of the present teachings, specifically HF solutions having low $H_2F_2$ species, the same etchant can be used for both lower electrode materials. Being able to use different lower electrode materials in different process flows with just one etchant simplifies processing and allows for a more flexible fabrication site without significant additional expense. Additionally, the excellent selectivity of these solutions from the sacrificial material to doped and undoped oxides allows the sacrificial material to be removed without substantially etching the field oxide.

It should be appreciated that the first conductive layer 40 may be deposited using any one of a number of generally known deposition techniques without departing from the scope of the present teachings. The thickness of the lower electrode can vary but preferably leaves room for subsequent conformal capacitor dielectric and upper electrode layers. Preferably the lower electrode is between about 100 Å and 500 Å thick, more preferably between about 150 Å and 250 Å thick.

FIG. 1F illustrates the removal of the sacrificial spacers from the sidewalls 14 of the recesses 12. The removal of sacrificial layer allows for access to three surfaces of the structural layer 10 to assist in subsequently removing the structural layer 10. The removal of the sacrificial spacers is preferably performed by a HF solution having a low percentage of the $H_2F_2$ species of hydrogen fluoride. As discussed above, the $H_2F_2$ species of hydrofluoric acid solution has been found responsible for most of the etching of doped and undoped oxides. By using an etchant according to the present teachings, excellent selectivity can be attained. For example, such an etchant will preferably remove a metallic layer, such as AlN, $Al_2O_3$, HfN, or $HfO_2$, selective to poly with an etch rate selectivity above about 2000:1, more preferably above about 10,000:1. The selectivity of metallic layers to oxide layers is preferably above about 500:1, more preferably above about 800:1, most preferably above about 1,000:1. Even greater selectivity can be attained with respect to tungsten and titanium nitride, preferably etching metal oxides and metal nitrides at greater than 7,000:1 selectivity versus tungsten or titanium nitride. With optimization of the etchant to the conditions of the etching process and the materials, the rate of selectivity can be even higher.

As shown in FIG. 1G, the structural layer 10 is removed before the deposition of a conformal capacitor dielectric 50. The dielectric 50 is deposited over the surface of the entire surface of the structure, including over the lower electrode 40 and the area formerly occupied by the structural layer 10. Various materials can be used for the capacitor dielectric 50, but some examples include some of the same materials that are preferred for the sacrificial layer 30 (FIG. 1C), such as aluminum oxide ($Al_2O_3$) and hafnium oxide ($HfO_2$). In many high capacity DRAMs, tantalum pentoxide ($Ta_2O_5$) is used as the capacitor dielectric 50. Tantalum pentoxide is easily deposited by CVD with good step coverage, and a high dielectric constant ("k value") of between about 20 and 25. Many other insulators can also function as the capacitor dielectric 50. The thickness of the capacitor dielectric 50 is selected to leave room for the upper electrode, but the thickness can generally be between about 10 nm and 350 nm, depending on the material and the capacitance desired. Deposition of the capacitor dielectric 50 can be performed through well-known processes for deposition of similar dielectric materials, such as CVD, or deposition of a metal followed by oxidation.

The removal of the structural layer 10 (FIG. 1F) is facilitated by the removal of the sacrificial spacers. The removal of the structural layer 10, as shown in FIG. 1G, is preferably performed using a standard oxide wet etch. The capillaries where the spacer was located can be used to access the structural layer 10 from the sides, in addition to the top of the structural layer 10. Etching from three sides allows for quick removal of the structural layer 10 and minimizes losses of the unpictured structural oxide in field regions outside the array.

FIG. 1H illustrates the deposition of an upper electrode 60, or second conductive layer to form a double-sided container capacitor. In a preferred embodiment, the same material that was used for the lower electrode is used for the upper electrode. Other preferred materials for the second conductive layer include tungsten silicide, elemental metal, or metal alloys. Skilled practitioners will appreciate that many conductive materials can be used for the upper electrode. The upper electrode's thickness can vary by several orders of magnitude depending on the application, and it can also be made up of several thin layers of conductive materials.

The capacitor in FIG. 1H can have several applications. Preferably, the capacitor serves as a memory cell capacitor in a DRAM array. FIG. 1I illustrates the capacitor of FIG. 1H adjacent another capacitor, as would occur in a memory array. The distance between the double-sided containers is preferably between about 50 nm and 160 nm, more preferably between about 60 nm and 150 nm. Additional layers can also be applied over the capacitor illustrated in FIGS. 1A-1I. An example of this is an insulator over the capacitor in order to further electrically isolate the capacitor.

Structure

The capacitor is preferably in an array for use as memory cell capacitors in DRAM. Individually, with reference to FIG. 1H, the capacitor will have a lower electrode 40 that is not substantially etched by the etchant of the present teachings. Preferably the lower electrode 40 comprises polysilicon, tungsten, or titanium nitride. The lower electrode 40 is preferably in direct contact with the plug 25. A conformal capacitor dielectric 50 extends over the lower electrode 40. The upper electrode 60 extends over the conformal capacitor dielectric. Optionally, the capacitor is covered with a layer of an insulator, which is not pictured, over the completed capacitors prior to upper metallization layers.

The dimensions of the capacitor can relate to the performance of the DRAM memory cell array. With reference to FIG. 1I, the height of the capacitor from the highest point 23 to base of the interior of the container 21 is preferably between about 800 nm and 3000 nm, more preferably between 1250 nm and 2500 nm. The diameter at the widest point of the container capacitor is between about 100 nm and 450 nm, more preferably about 175 nm and 375 nm. The distance 22 between two capacitors in the memory cell array is preferably between about 50 nm and 160 nm, more preferably between about 60 nm and 150 nm.

Figure 2A:
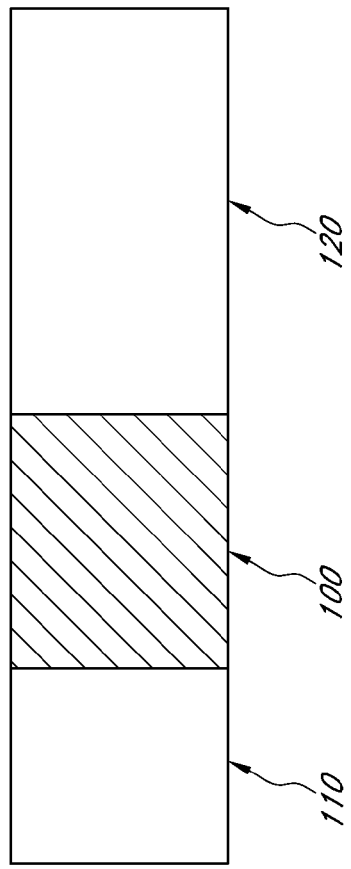
FIGS. 2A-2B illustrate one embodiment of a method using an etchant of the present teachings to selectively etch a metallic layer while leaving exposed oxide layers substantially unetched.
Figure 2B:
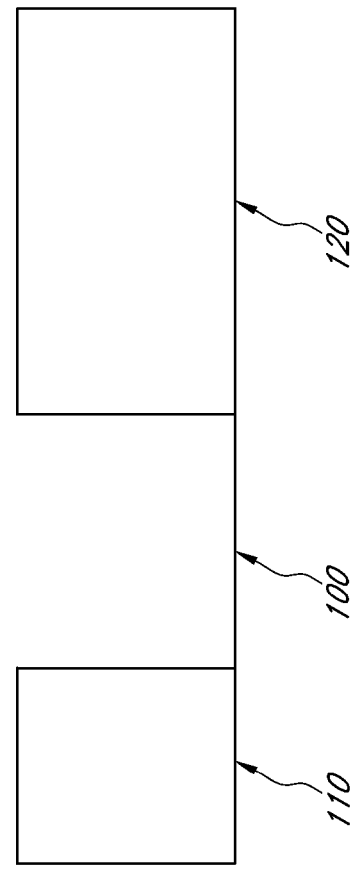

The etch solution according to the present teachings can also be used more generally to selectively etch metallic layers, such as metal nitrides and metal oxides. In FIG. 2A, two oxide layers, 110 and 120 are on both sides of a metallic layer 100. In FIG. 2B, the metallic layer 100 has been removed by applying the etchant of the present teachings. The etchant can comprise an ultradilute HF solution or an ultrabuffered HF solution as discussed above. As discussed above, the solutions described herein can also selectively etch metal oxides and metal nitrides relative to polysilicon and tungsten.

For etching some metal oxides in narrow spaces, heat is preferably applied to speed the etch process. As discussed above, some metal oxides and metal nitrides etch faster than others do. For materials such as $Al_2O_3$, the etch rate may not be fast enough to reach the entirety of the sacrificial material. The heat increases the etch rate sufficiently to allow the entire sacrificial layer to be etched. An etchant according to the present teachings is then used to remove the sacrificial spacer from the layered structure. The properties of the etchant allow for an excellent selectivity ratio.

It will be appreciated by those skilled in the art that various omissions, additions and modifications may be made to the methods and structures described above without departing from the scope of the invention. All such modifications and changes are intended to fall within the scope of the invention, as defined by the appended claims.

I claim:

1. A method of forming a conductor on a substrate, the method comprising:
    forming a recess on the substrate;
    lining the recess with a sacrificial material comprising metal nitride or metal oxide;
    forming a conductive material within the recess; and
    removing the sacrificial material with an etch solution comprising an aqueous hydrofluoric acid etchant, wherein a ratio of an etch rate of the sacrificial material in the etch solution to an etch rate of the conductive material in the etch solution is greater than about 500:1.

2. The method of claim 1, wherein forming the conductive material comprises depositing the conductive material in contact with the sacrificial liner over inner sidewalls of the recess.

3. The method of claim 1, wherein forming the recess on the substrate includes forming a structural layer on the substrate and etching the structural layer.

4. The method of claim 3, wherein lining the recess further comprises removing the sacrificial layer from a bottom surface of the recess and from a top surface of the structural layer.

5. The method of claim 3, wherein forming the conductive material further includes removing the conductive material from over the structural layer by chemical mechanical polishing.

6. The method of claim 4, further including removing structural layer after removing the sacrificial material.

7. The method of claim 1, wherein lining the recess comprises depositing aluminum oxide.

8. The method of claim 1, wherein lining the recess comprises depositing hafnium oxide.

9. The method of claim 1, wherein lining the recess comprises depositing aluminum nitride.

10. The method of claim 1, wherein lining the recess comprises conformally lining the inner sidewalls of the recess via chemical vapor deposition.

11. The method of claim 1, wherein depositing the conductive material comprises depositing polysilicon.

12. The method of claim 1, wherein depositing the conductive material comprises depositing titanium nitride.

13. The method of claim 1, wherein depositing the conductive material comprises depositing tungsten.

14. The method of claim 1, wherein removing the sacrificial material comprises wet-etching using a hydrofluoric acid (HF) solution as the etch solution, the HF solution having a $H_2F_2$ concentration of less than 0.06 mole fraction.

15. The method of claim 1, wherein the ratio is greater than about 2000:1.

16. The method of claim 1, wherein the sacrificial material comprises aluminum or hafnium.

* * * * *